United States Patent [19]

Jurasek et al.

[11] Patent Number: 5,527,187
[45] Date of Patent: Jun. 18, 1996

[54] COMPLIANT ELECTRICAL INTERCONNECT

[75] Inventors: Gordan Jurasek, Canton; Douglas P. Gerrelts, Romulus, both of Mich.; Victor V. Zaderej, Branford, Conn.

[73] Assignee: Ford Motor Company, Dearborn, Mich.

[21] Appl. No.: 341,233

[22] Filed: Nov. 17, 1994

[51] Int. Cl.⁶ .................................................. H01R 13/64
[52] U.S. Cl. .............................. 439/24.7; 439/246
[58] Field of Search ........................ 439/31, 56, 77, 439/81, 82, 248, 554, 593, 246, 247

[56] References Cited

U.S. PATENT DOCUMENTS

| H921 | 5/1991 | Wannemacher, Jr. | 361/767 |
|---|---|---|---|
| 3,979,763 | 9/1976 | Mills | 354/187 |
| 4,109,298 | 8/1978 | Hanni et al. | 174/261 |
| 4,191,441 | 3/1980 | Ryder et al. | 439/77 |
| 4,359,277 | 11/1982 | Shimizu et al. | 354/219 |
| 4,587,719 | 5/1986 | Barth | 29/577 |
| 4,641,222 | 2/1987 | Derfiny et al. | 361/403 |
| 4,667,270 | 5/1987 | Yagi | 361/380 |
| 4,758,459 | 7/1988 | Mehta | 428/131 |
| 4,986,870 | 1/1991 | Frohlich | 156/382 |
| 5,008,496 | 4/1991 | Schmidt et al. | 174/254 |
| 5,064,379 | 11/1991 | Ryll et al. | 439/81 |
| 5,067,229 | 11/1991 | Nakamura | 29/566.1 |
| 5,100,492 | 3/1992 | Kober et al. | 156/250 |
| 5,131,853 | 7/1992 | Meyer | 439/82 |
| 5,132,877 | 7/1992 | Branan et al. | 439/76 |
| 5,142,448 | 8/1992 | Kober et al. | 361/398 |
| 5,353,190 | 11/1994 | Nakayama | 439/34 |
| 5,397,239 | 3/1995 | Zaderej et al. | 439/55 |

FOREIGN PATENT DOCUMENTS

| 1766162 | 10/1969 | Germany . |
|---|---|---|
| 4-246882 | 9/1992 | Japan . |
| 1287074 | 8/1972 | United Kingdom . |

OTHER PUBLICATIONS

"Abrasion Resistance Helps Fold Miniaturization Problems Down to Size" in Electronic Design, p. 132, Aug. 1962.

*Primary Examiner*—P. Austin Bradley
*Assistant Examiner*—Jill Demello
*Attorney, Agent, or Firm*—Mark S. Sparschu; Roger L. May

[57] ABSTRACT

A circuit board for an instrument cluster comprises injection-molded plastic springs connecting islands of the circuit board to a main portion of the circuit board. Each island further has integrally-molded clips residing in the plane of the island. The clips are adapted for insertion and retention of terminals of electrical gauge movements. When the electrical gauge movements are attached to the circuit board via the clips, the springs provide compliance so that the gauge movements can then be attached to one or more face plates of the instrument cluster. The compliance provided by the springs allows tolerance stack-ups among the various components of the instrument cluster assembly to be overcome.

12 Claims, 4 Drawing Sheets

COMPLIANT ELECTRICAL INTERCONNECT

BACKGROUND OF THE INVENTION

1. Field of the Invention

The present invention relates to circuit board interconnections for electrical and electronic components.

2. Description of the Related Art

In the assembly of automotive instrument clusters with analog gauges, one or more gauge movements are attached to the backs of one or more face plates of the instrument cluster. The front of each face plate contains an appliqué with graduations (such as "miles per hour" graduations for a speedometer). Pointers attached to staffs of the gauge movements indicate the gauge readings with reference to the graduations on the appliqués.

A typical automotive instrument cluster contains four or more gauges. This implies that four or more gauge movements are attached to the backs of the face plates. Each gauge movement is typically attached with two screws which are driven through mounting holes on the gauge movements and into mounting bosses on the back of a face plate.

In the assembly of a typical instrument cluster, the gauge movements are connected to a circuit board, which provides the electrical signals to drive the gauge movements. In one prior art assembly method, this connection is made through holes in the circuit board, one hole for each terminal of each gauge movement. Once the terminals are inserted into the holes, the terminals are soldered to the circuit board. Once the terminals are soldered to the circuit board, each gauge movement is screwed to the back of a face plate of the cluster, as discussed above.

However, this latter step of attaching the gauge movements to the backs of the face plates can pose some difficulty. Once the terminals of the gauge movements are soldered to the circuit board, the gauge movements are rigidly fixed to the circuit board. However, tolerance stack-ups in the various components of the instrument cluster make it likely that not all of the gauge movements will then be exactly positioned for mounting to the backs of the face plates.

One solution to this problem is disclosed in pending U.S. patent application Ser. No. 08/136,843, by Davis. This application discloses the provision of "islands" on the circuit board, which contain the holes into which the terminals of the gauge movements are inserted. These islands are each connected to the remainder of the circuit board by springs formed in the circuit board material. The gauge movements thus attached to those islands are therefore somewhat compliantly connected to the circuit board. This compliance allows the above-referenced tolerance stack-up to be overcome and all of the gauge movements to be attached to the face plates of the instrument cluster.

However, the invention disclosed by Davis, although effective, still has two shortcomings. First, the circuit board in the embodiment disclosed therein is made of fiberglass material and the springs formed in the circuit board are formed by punching. The resulting springs are therefore of rather large dimensions. Smaller springs would allow a more compact instrument cluster to be made. Second, Davis discloses soldering of the gauge movement terminals to the circuit board. If this step can be eliminated in attaching the gauge movement terminals to the circuit board (as well as other prior-art methods of attaching gauge movements to a circuit board such as clips mounted to the circuit board), the instrument cluster can likely be assembled more simply and inexpensively.

SUMMARY OF THE INVENTION

The present invention provides a circuit board, the circuit board comprising a first portion and an island comprising electrical component connecting provisions. The island is flexibly connected to the first portion by springs. Further, the first portion, the springs and the island are integrally formed of plastic.

The present invention further provides a circuit board adapted for connection and retention of at least one leaded electrical component. The circuit board includes at least one planar portion. The circuit board further comprises a plurality of clips disposed on the at least one planar portion, the clips residing in the plane of the planar portion. Each clip further comprises two electrically conductive walls in opposition to one another, the walls defining an aperture extending through the planar portion. The walls of the clip are of a thickness and have a spacing to be elastically deformed by and to grip a lead of an electrical component when the lead is inserted into the aperture.

The present invention provides smaller springs than in the prior art, allowing for a more compact instrument cluster. Further, the clips provided by the invention allow connection of electrical components to a circuit board without solder and without separate attaching means mounted to the circuit board.

DETAILED DESCRIPTION OF THE PREFERRED EMBODIMENT

Figure 1:
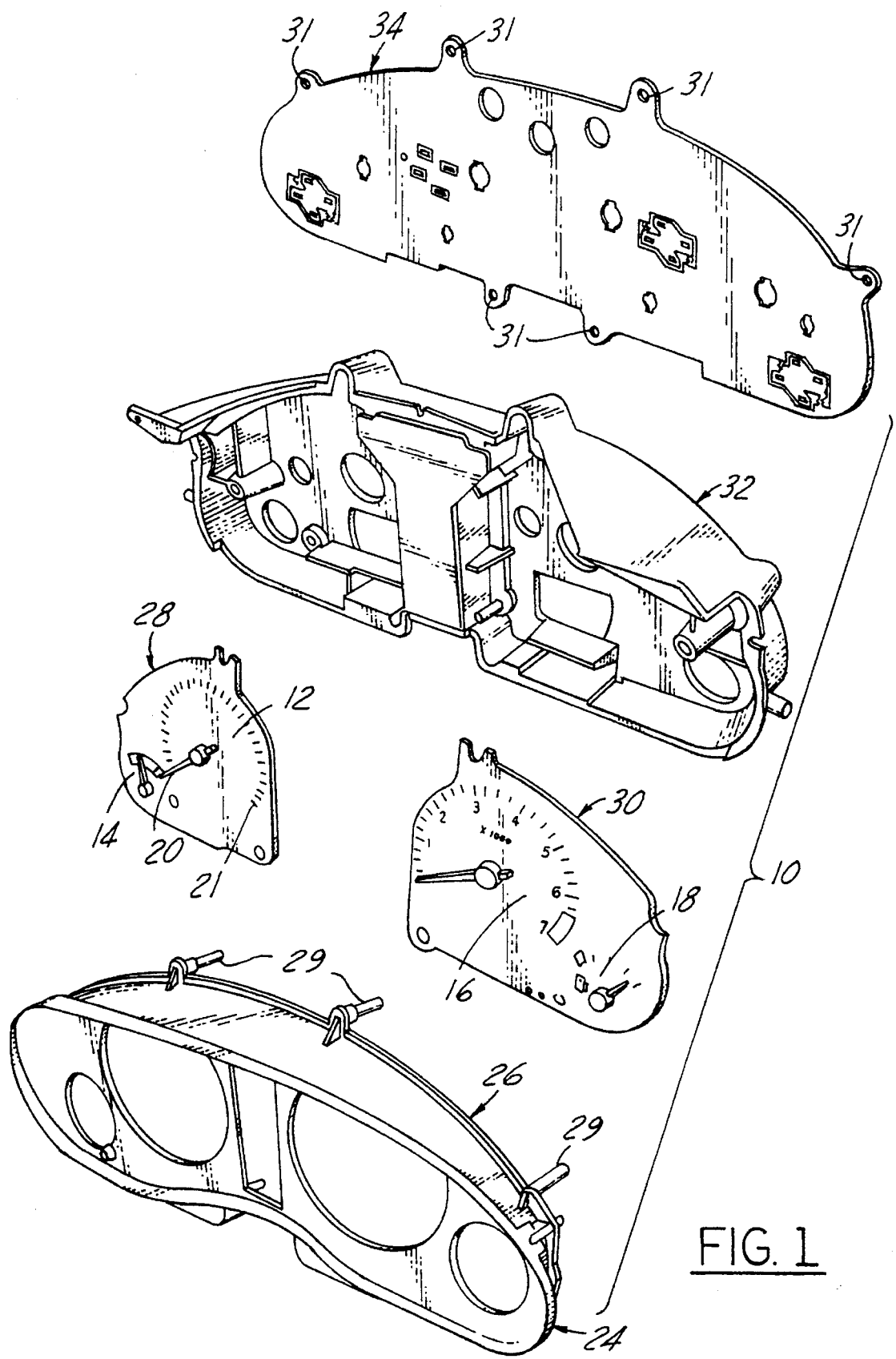
FIG. 1 is an exploded view of instrument cluster 10.

Referring to FIG. 1, an instrument cluster 10 according to one embodiment of the present invention is illustrated. Instrument cluster 10 comprises four gauges 12, 14, 16 and 18. Gauges 12, 14, 16 and 18 each further comprise a pointer (for example, pointer 20 on gauge 12). The pointers are mounted on gauge movements (not shown in FIG. 1). The gauge movements drive the pointers to the proper rotational position to display the gauge readings on graduations (for example, graduations 21) on the face of instrument cluster 10.

Instrument cluster 10 comprises a clear plastic lens 24. Lens 24 attaches to plastic bezel 26, which has four openings through which gauges 12, 14, 16 and 18 can be viewed. Behind bezel 26 are two face plate sub-assemblies 28 and 30. Gauges 12 and 14 are parts of face plate sub-assembly 28, and gauges 16 and 18 are parts of face plate subassembly 30. Bezel 26 attaches to plastic housing 32 and to circuit board 34 via screws driven through holes 31 in circuit board 34 into bosses 29 in bezel 26.

Figure 2:
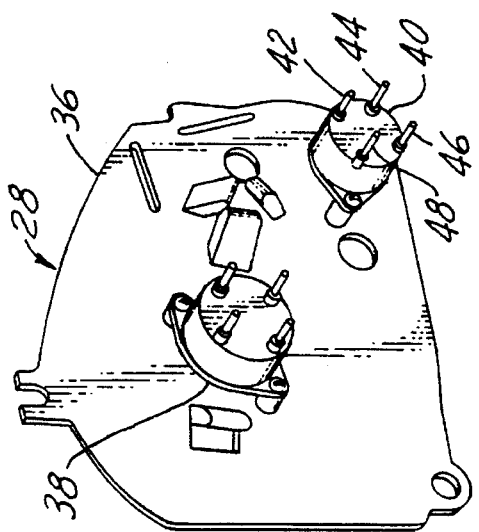
FIG. 2 is a rear perspective view of face plate sub-assembly 28 of instrument cluster 10.

FIG. 2 shows a rear perspective view of face plate sub-assembly 28. Face plate sub-assembly 28 comprises plastic face plate 36. Screwed to face plate 36 are gauge movements 38 and 40, for gauges 12 and 14, respectively. Gauge movements 38 and 40 each have four electrical terminals (or "leads"). For example, the terminals on gauge movement 40 are labelled with reference numerals 42, 44, 46 and 48. The terminals are cylindrical, as is usual in the art.

A key point to recognize here is that once gauge movements 38 and 40 are attached to face plate 36, the positions of the terminals of gauge movements 38 and 40 are fixed. That is, the attachment of gauge movements 38 and 40 to face plate 36 is essentially rigid.

A second key point to recognize is that the positions of gauge movements 38 and 40 from face plate sub-assembly to face plate sub-assembly are subject to slight variation. This variation is due to dimensional variations in face plate 36, which is an injection-molded plastic part. Because the positions of gauge movements 38 and 40 vary from face plate sub-assembly to face plate sub-assembly, the position of the terminals of gauge movements 38 and 40 vary from one face plate sub-assembly to another as well.

Figure 3:
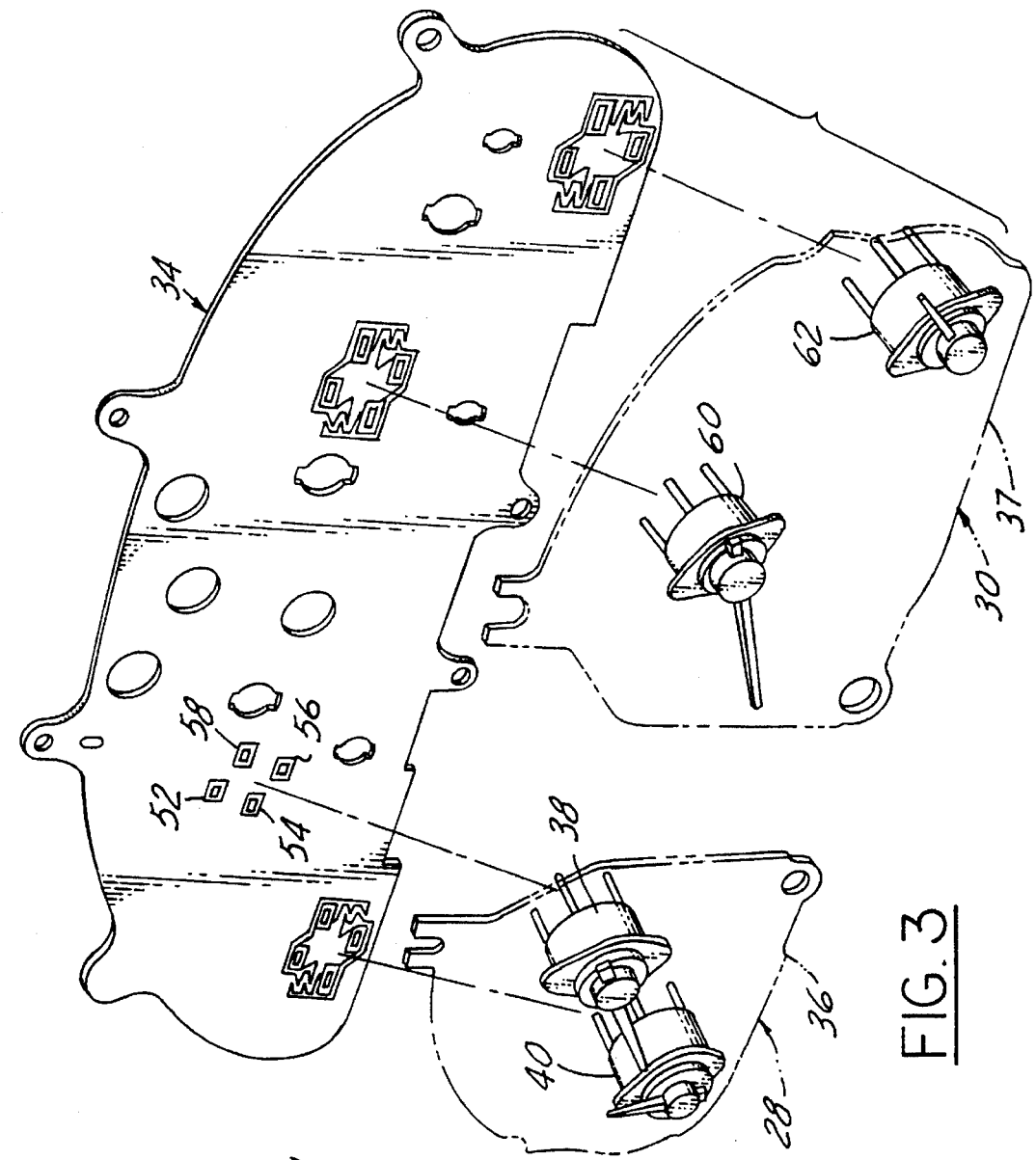
FIG. 3 is an exploded view of face plate sub-assemblies 28 and 30 and circuit board 34 of instrument cluster 10.

Refer now to FIG. 3, where only face plate sub-assemblies 28 and 30 and circuit board 34 are shown. (In this figure, face plates 36 and 37 are shown in shadow, so the terminals of gauge movements 38, 40, 60 and 62 can be seen.) Circuit board 34 comprises clips (such as clips 52, 54, 56 and 58) for grabbing the terminals of gauge movements 38, 40, 60 and 62 and for making the electrical connections of the terminals to circuit board 34. However, because the terminals are rigidly attached within face plate sub-assemblies 28 and 30, and because there is the aforementioned variation of the locations of the terminals, some ability for the clips to move in the two axes of circuit board 38 is needed to facilitate insertion of the terminals into the clips.

Figure 4:
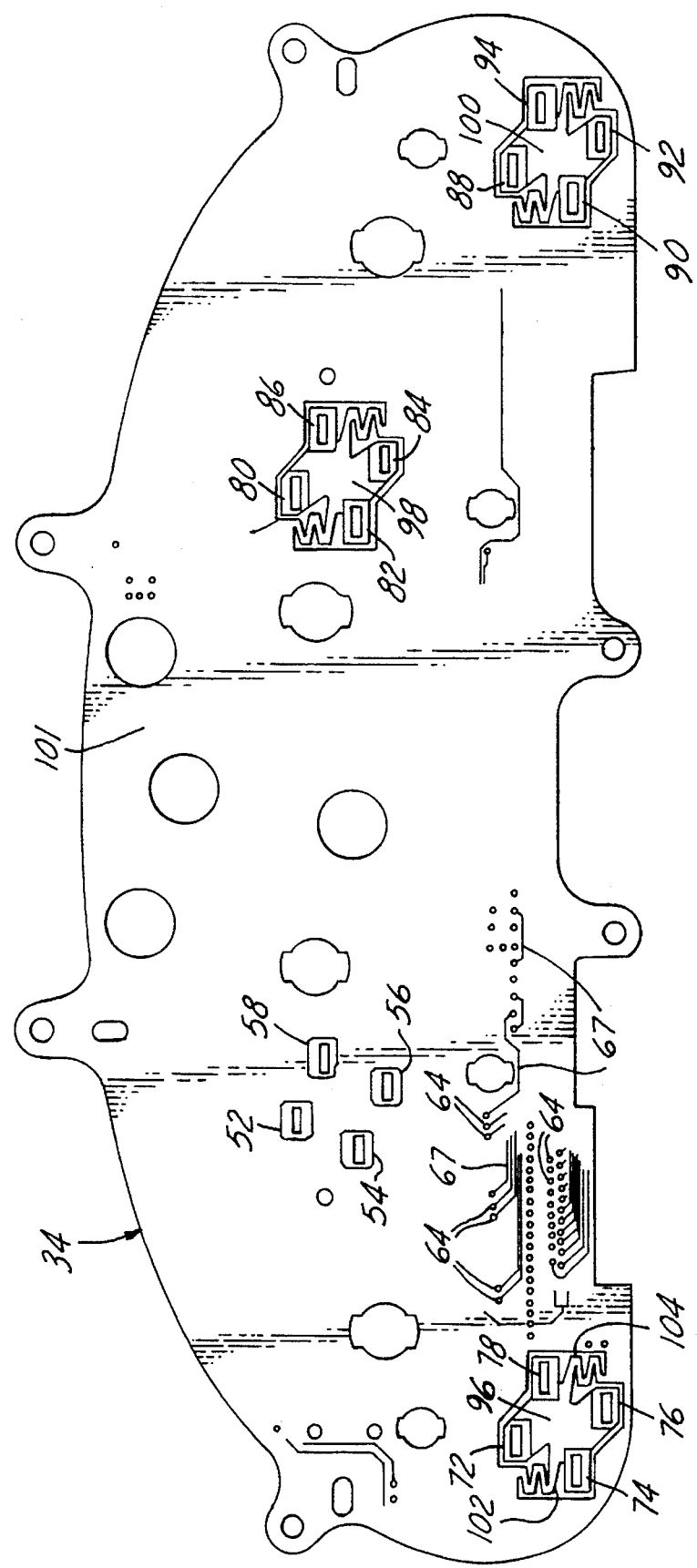
FIG. 4 is a front view of circuit board 34 of instrument cluster 10.

FIG. 4 illustrates circuit board 34. Circuit board 34 is preferably a two-layer circuit board. In the embodiment of instrument cluster 10 described here, circuit board 34 has attached to it electronic components (integrated circuits, resistors, capacitors, and the like) to perform various functions of instrument cluster 10. Because of those electronics, circuit board 34 contains numerous through holes (such as holes 64) for attachment of the electronic components. Circuit board 34 further comprises embedded circuit traces (such as circuit traces 67), for carrying electrical signals between the various components connected to circuit board 34.

Circuit board 34 further comprises the aforementioned clips 52, 54, 56 and 58, as well as clips 72, 74, 76, 78, 80, 82, 84, 86, 88, 90, 92 and 94. These 16 clips are for the 16 terminals of the four gauge movements 38, 40, 60 and 62. Clips 72, 74, 76, 78, 80, 82, 84, 86, 88, 90, 92 and 94 are located on islands 96, 98 and 100. Islands 96, 98 and 100 are isolated from the main portion 101 of circuit board 34 by springs (for example, springs 102 and 104 which isolate island 96). The islands and the clips on the islands (for example, clips 72, 74, 76 and 78 on island 96) are thus free to move relative to the rest of circuit board 34 in the two axes which define the plane of circuit board 34. (There is also some freedom in the third axis, but that is not particularly important in solving the immediate problem herein described of misalignment between gauge movement terminals and clips.)

The two-axis movement of islands 96, 98 and 100 allows clips (for example, clips 72, 74, 76 and 78) to be moveable for alignment with the terminals of the gauge movements (for example, terminals 42, 44, 46 and 48) when mating of the terminals and circuit board 34 is performed. This overcomes the alignment problem caused by variations in the locations of the terminals of gauge movements 38, 40, 60 and 62 after the gauge movements have been attached in face plate subassemblies 28 and 30.

Circuit board 34 is preferably injection molded from plastic, preferably polyetherimide. (Polyetherimide is marketed by the General Electric Corporation under the trade name "Ultem".) The injection molding produces a substrate which has the physical features of circuit board 34, including holes (such as holes 64), clips (such as clips 72, 74, 76 and 78), islands 96, 98 and 100 and springs (such as springs 102 and 104). Once the substrate is so formed, copper is selectively applied to the top and bottom surfaces of the substrate to form circuit traces (such as circuit traces 67). The holes of circuit board 34 (such as holes 64) and the clips (such as clips 72, 74 and 76 and 78) are also copper plated. The copper application processes are conventional in the art and will not be described in detail here.

Figure 5:
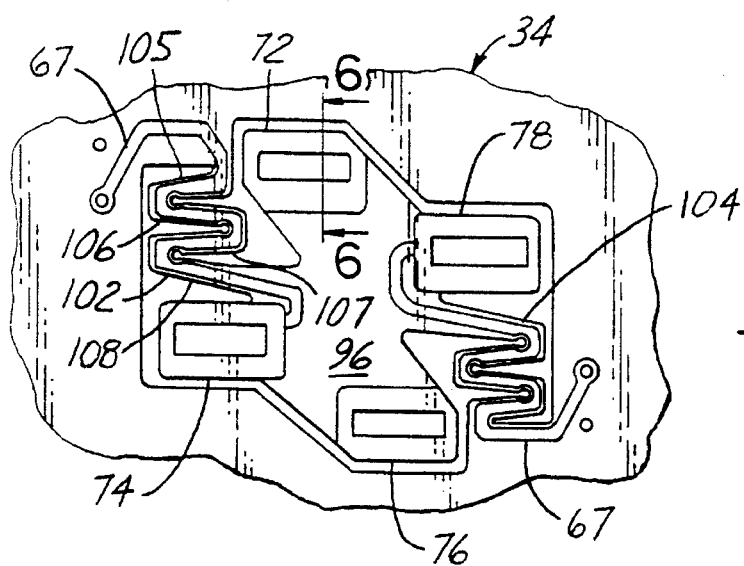
FIG. 5 is an enlarged view of island 96 and springs 102 and 104 of FIG. 5.

It can be appreciated from the description of circuit board 34 that main portion 101, springs (such as springs 102 and 104) and islands 96, 98 and 100 are integrally formed. (That is, they are formed at the same time, with no subsequent attachment process or attachment means employed to join them together.) FIG. 5 also illustrates that main portion 101, springs (such as springs 102 and 104) and islands 96, 98 and 100 reside in a common plane.

Referring now to FIG. 5, spring 102 will be described in more detail. (The other springs disclosed herein are typical of the other springs disclosed herein.) Spring 102 comprises beams 105, 106, 107 and 108. The beams each have a length and a width. The width of beams 105, 106, 107 and 108 is preferably about 2 millimeters or less. Injection molding, the preferred process for fabricating circuit board 34, helps make the relatively small 2 millimeter width practical. Such a small width helps keep circuit board 34 (and therefore also instrument cluster 10) compact.

It will also be noted in FIG. 5 that circuit traces 67 extend from clips 74 and 78 along the tops of springs 102 and 104. In the preferred embodiment of the present invention, those circuit traces 67 are the means by which electrical signals are routed from clips 74 and 78 to the remainder of circuit board 34. Similar circuit traces from clips 72 and 76 run along the bottoms of springs 102 and 104.

Figure 6:
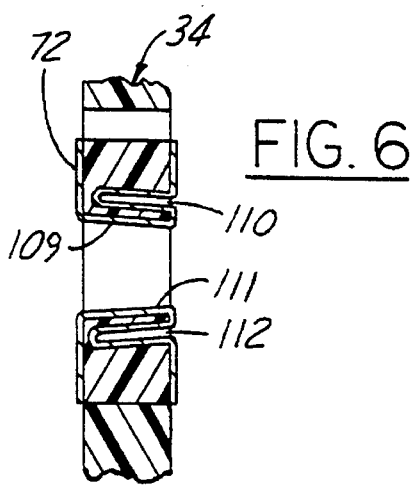
FIG. 6 is a sectional view of clip 72 of circuit board 34, taken along line 6—6 of FIG. 5.

Referring now to FIG. 6, clip 72 will be described. Clip 72 is typical of all 16 clips 52, 54, 56, 58, 72, 74, 76, 78, 80, 82, 84, 86, 88, 90, 92 and 94 disclosed herein. Clip 72 comprises two walls 109 and 111, adjacent to which are voids 110 and 112, respectively. Walls 109 and 111 are copper plated and in turn electrically connected via plating to circuit traces of circuit board 34 (as discussed in the previous paragraph). Clip 72 is located in the plane of island 96.

Figure 7:
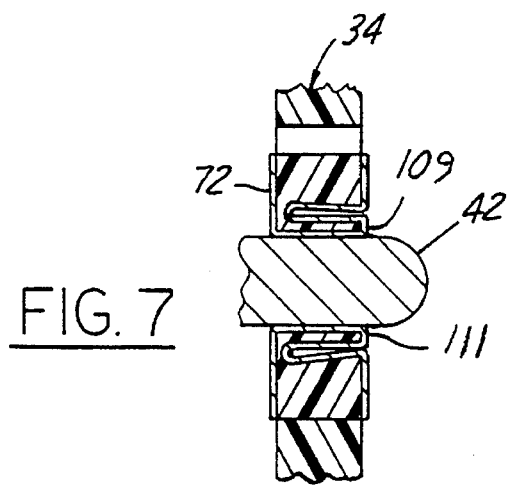
FIG. 7 is the sectional view of FIG. 6 further showing the insertion of a terminal of a gauge movement into clip 72.

Refer now to FIG. 7. When a terminal (for example, terminal 42) of a gauge movement is inserted into clip 72, interference between terminal 42 and walls 109 and 111 causes walls 109 and 111 to be pushed toward voids 110 and 112 (FIG. 6) by terminal 42. However, walls 109 and 111 are elastically deformed, not permanently deformed. Walls 109 and 111 thus exert pressure on terminal 42, holding terminal 42 in place. In this way, gauge movements 38, 40, 60 and 62 can be attached mechanically and electrically to circuit board 34 without solder and without separate clips typically used to attach gauge terminals to circuit boards. One of ordinary skill in the art will certainly recognize that the clips disclosed herein (such as clip 72) can be used for attachment of various other leaded electrical and electronic components, in addition to electrical gauge movements.

Various other modifications and variations will no doubt occur to those skilled in the arts to which this invention pertains. Such variations which generally rely on the teachings through which this disclosure has advanced the art are properly considered within the scope of this invention. This disclosure should thus be considered illustrative, not limiting; the scope of the invention is instead defined by the following claims.

What is claimed is:

1. A circuit board comprising:

a first portion;

an island comprising electrical component connecting provisions; wherein said island is flexibly connected to said first portion by springs; and said first portion, said springs and said island are integrally formed of plastic.

2. A method for fabricating the circuit board recited in claim 1, said method comprising the step of integrally fabricating said first portion, said springs and said island by injection molding.

3. An instrument cluster comprising:

a face plate;

a circuit board as recited in claim 1;

at least one electrical gauge movement having a plurality of electrical terminals;

wherein said terminals of said gauge movement are retained by said clips of said circuit board and said gauge movement is further coupled to said face plate.

4. A circuit board as recited in claim 1, wherein said springs, said island and first portion are planar and reside in a common plane.

5. A circuit board as recited in claim 4, wherein at least one of said springs is plated with an electrical conductor.

6. A circuit board as recited in claim 5, wherein said springs further comprise non-collinear beams, said beams being approximately 2 millimeters or less in width.

7. A circuit board as recited in claim 6, wherein said first portion, said island and said springs are fabricated by injection molding.

8. A method for fabricating the circuit board recited in claim 4, said method comprising the step of integrally fabricating said first portion, said springs and said island by injection molding.

9. A circuit board as recited in claim 1, wherein:

said island is substantially planar; and said electrical component connecting provisions each comprise a plurality of clips which reside in the plane of said island, wherein each clip further comprises two electrically conductive walls in opposition to one another, said walls defining an aperture extending through said island, said walls being of a thickness and having a spacing to be elastically deformed by and to grip a lead of an electrical component when said lead is inserted into said aperture.

10. A circuit board as recited in claim 9, wherein said clips are integrally formed of plastic with said island and wherein said clips are coated with an electrically conductive material.

11. A circuit board as recited in claim 10, wherein:

said circuit board further comprises circuit traces; and said clips are electrically coupled with said circuit traces.

12. A circuit board as recited in claim 11, wherein said spacing is chosen to accommodate insertion and retention of a terminal of an electrical gauge movement.

\* \* \* \* \*